United States Patent
Haidinyak et al.

(10) Patent No.: US 7,875,851 B1
(45) Date of Patent: Jan. 25, 2011

(54) ADVANCED PROCESS CONTROL FRAMEWORK USING TWO-DIMENSIONAL IMAGE ANALYSIS

(75) Inventors: Chris Haidinyak, Santa Clara, CA (US); Jason P. Cain, Sunnyvale, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 388 days.

(21) Appl. No.: 11/381,000

(22) Filed: May 1, 2006

(51) Int. Cl.
*G01N 21/88* (2006.01)

(52) U.S. Cl. .............. 250/311; 250/306; 250/307; 250/310; 250/492.1; 250/492.2; 700/121; 700/122

(58) Field of Classification Search .......... 250/310, 250/306, 307, 311, 492.1, 492.2; 382/144; 700/122, 29, 32, 121, 19; 356/237.4, 394
See application file for complete search history.

(56) References Cited

U.S. PATENT DOCUMENTS

| | | | | |
|---|---|---|---|---|
| 5,872,358 | A * | 2/1999 | Todokoro et al. | 250/310 |
| 5,994,009 | A | 11/1999 | Tzu et al. | |
| 6,243,855 | B1 | 6/2001 | Kobayashi | |
| 6,263,255 | B1 * | 7/2001 | Tan et al. | 700/121 |
| 6,292,582 | B1 * | 9/2001 | Lin et al. | 382/149 |
| 6,337,217 | B1 * | 1/2002 | Hause et al. | 438/7 |
| 6,388,253 | B1 * | 5/2002 | Su | 250/310 |
| 6,509,201 | B1 * | 1/2003 | Wright | 438/16 |
| 6,633,174 | B1 * | 10/2003 | Satya et al. | 324/751 |
| 6,643,557 | B1 * | 11/2003 | Miller et al. | 700/110 |
| 6,645,780 | B1 * | 11/2003 | Sonderman et al. | 438/14 |
| 6,868,301 | B1 * | 3/2005 | Preil | 700/121 |
| 6,931,618 | B1 * | 8/2005 | Tabery et al. | 716/19 |
| 6,999,614 | B1 * | 2/2006 | Bakker et al. | 382/159 |
| 7,076,320 | B1 * | 7/2006 | Phan et al. | 700/121 |
| 7,123,356 | B1 * | 10/2006 | Stokowski et al. | 356/237.2 |
| 7,126,699 | B1 * | 10/2006 | Wihl et al. | 356/625 |
| 7,301,645 | B2 * | 11/2007 | Wang et al. | 356/503 |
| 7,369,697 | B2 * | 5/2008 | Starikov | 382/141 |
| 7,379,175 | B1 * | 5/2008 | Stokowski et al. | 356/237.5 |
| 2001/0012394 | A1 * | 8/2001 | Yoshida | 382/149 |
| 2001/0033328 | A1 * | 10/2001 | Martel | 348/125 |
| 2003/0015660 | A1 * | 1/2003 | Shishido et al. | 250/311 |
| 2003/0119216 | A1 * | 6/2003 | Weed | 438/14 |
| 2003/0139838 | A1 * | 7/2003 | Marella | 700/110 |
| 2003/0219658 | A1 * | 11/2003 | Shishido et al. | 430/30 |
| 2005/0026310 | A1 * | 2/2005 | Zhao et al. | 438/14 |
| 2005/0158653 | A1 * | 7/2005 | Hatakeyama et al. | 430/270.1 |
| 2005/0221207 | A1 * | 10/2005 | Nagatomo et al. | 430/30 |
| 2005/0240895 | A1 * | 10/2005 | Smith et al. | 716/19 |
| 2005/0281451 | A1 * | 12/2005 | Starikov | 382/141 |
| 2006/0113469 | A1 * | 6/2006 | Baba et al. | 250/310 |

(Continued)

*Primary Examiner*—Bernard E Souw
*Assistant Examiner*—Michael J Logie
(74) *Attorney, Agent, or Firm*—Turocy & Watson, LLP

(57) ABSTRACT

The claimed subject matter provides a system and/or a method that facilitates utilizing a resolution enhancement for a circuit feature. A scanning electron microscope component (104, 204, 304, 404) can provide at least one two-dimensional image of the circuit feature. An image analysis engine (106, 206, 306, 406) can analyze the two-dimensional image. An advanced process control (APC) engine (108, 208, 308, 408) can generate at least one instruction for at least one of a feed forward control and a feedback control and a process component (102, 202, 302, 402) can utilize the at least one instruction to minimize an error.

20 Claims, 12 Drawing Sheets

U.S. PATENT DOCUMENTS

| | | | |
|---|---|---|---|
| 2006/0161288 A1* | 7/2006 | Imai | 700/121 |
| 2006/0219906 A1* | 10/2006 | Langer et al. | 250/310 |
| 2007/0050749 A1* | 3/2007 | Ye et al. | 716/20 |
| 2007/0122920 A1* | 5/2007 | Bornstein et al. | 438/5 |
| 2007/0156379 A1* | 7/2007 | Kulkarni et al. | 703/14 |
| 2007/0185684 A1* | 8/2007 | Vuong et al. | 702/182 |
| 2007/0288219 A1* | 12/2007 | Zafar et al. | 703/14 |
| 2008/0137078 A1* | 6/2008 | Lally et al. | 356/237.2 |
| 2008/0237487 A1* | 10/2008 | Pinto et al. | 250/492.1 |

\* cited by examiner

ADVANCED PROCESS CONTROL FRAMEWORK USING TWO-DIMENSIONAL IMAGE ANALYSIS

CROSS-REFERENCE TO RELATED APPLICATION(S)

This application relates to U.S. Pat. No. 6,824,937 filed on Nov. 30, 2004, entitled "METHOD AND SYSTEM FOR DETERMINING OPTIMUM OPTICAL PROXIMITY CORRECTIONS WITHIN A PHOTOLITHOGRAPHY SYSTEM," and U.S. Pat. No. 6,982,136 filed on Jan. 3, 2006, entitled "METHOD AND SYSTEM FOR DETERMINING OPTIMUM OPTICAL PROXIMITY CORRECTIONS WITHIN A PHOTOLITHOGRAPHY SYSTEM." The entireties of which applications are incorporated herein by reference.

TECHNICAL FIELD

The subject innovation relates generally to semiconductor fabrication, and more particularly, to systems and/or methods that enhances an advanced process control framework.

BACKGROUND

In the semiconductor industry, there is a continuing trend toward higher device densities. To achieve these higher device densities there have been, and continue to be, efforts toward scaling down the device dimensions on semiconductor wafers. This continuing trend has also led to advanced monitoring and quality control of every step of the semiconductor manufacturing process.

High resolution lithographic processes are used to achieve small features. In general, lithography refers to processes for pattern transfer between various media. In lithography for integrated circuit fabrication, a silicon slice, the wafer, is coated uniformly with a radiation-sensitive film, the resist. The film is selectively exposed with radiation (such as optical light, x-rays, or an electron beam) through an intervening master template, the mask, forming a particular pattern. Exposed areas of the coating become either more or less soluble than the unexposed areas (depending on the type of coating) in a particular solvent developer. The more soluble areas are removed with the developer in a developing step. The less soluble areas remain on the silicon wafer forming a patterned coating. The pattern corresponds to the image of the mask or its negative. The patterned resist is used in further processing of the silicon wafer.

Within lithography, patterns are transferred from a photomask or reticle onto a photoresist layer which overlies the film on the wafer through an exposure process. If the photomask or reticle contains defects, even submicron in range, such defects may be transferred to a wafer during the exposure. Such defects may be generated by the fabrication process utilized to produce the mask or reticle as well as during subsequent handling and processing. Such defects generally fall into two classes: fatal (or killer) defects and nonfatal defects.

Critical dimensions of the patterned resist, such as line widths, affect the performance of the finished product and are sensitive to processing conditions. Processing conditions that affect critical dimensions include conditions relating to resist application, pre-baking, resist exposure, post-baking, and resist development. A few degrees variation in the pre-bake temperature, for example, can have a significant affect on critical dimensions. Many of the conditions that affect critical dimensions are difficult to control, often resulting in variations from batch to batch.

Techniques, equipment and monitoring systems have concentrated on preventing and reducing defects within the lithography process. For example, aspects of the resist process which are typically monitored are: whether the correct mask has been used; whether resist film qualities are acceptable (e.g., resist is free from contamination, scratches, bubbles, striations, etc.); whether image quality is adequate (e.g., good edge definition, linewidth uniformity, or indications of bridging); whether critical dimensions are within the specified tolerances; whether defect types and densities are recorded; and whether registration is within specified limits.

Within the lithography process, two automated areas of defect detection have been concentrated upon: electrical signal analysis and image analysis. By using an electrical signal analysis, defects such as "opens" in circuitry, unwanted electrical bridges, and electrical failures can be detected within the silicon wafers. Image analysis can consist of overlay inspection (OL) and critical dimension inspection (CD), which are used to determine the quality of the lithography process. The OL inspection measures the registration of consecutive layers of multi-layer semiconductor chips. During the inspection, the wafer is moved to an optical microscope. Under this optical microscope the position of marks or targets of the previous processed layer are measured against the marks of the layer that is currently being added. The CD inspection measures the layer line-widths. The wafer is moved to a high-resolution CD-SEM (Critical Dimension Scanning Electron Microscope) where the line-width is measured and determined to be within a threshold or pre-determined tolerance.

SUMMARY

The following presents a simplified summary of the innovation in order to provide a basic understanding of some aspects described herein. This summary is not an extensive overview of the claimed subject matter. It is intended to neither identify key or critical elements of the claimed subject matter nor delineate the scope of the subject innovation. Its sole purpose is to present some concepts of the claimed subject matter in a simplified form as a prelude to the more detailed description that is presented later.

The subject innovation relates to systems and/or methods that facilitate utilizing two-dimensional image analysis within an advanced process control framework to enhance resolution. A scanning electron microscope (SEM) component can provide at least one two-dimensional image in a semiconductor patterning process. The two-dimensional image can provide substantial benefits over conventional techniques and/or images utilized within the lithographic patterning process. The SEM component can further provide the two-dimensional image for image analysis in connection with an image analysis engine. The image analysis engine can extract information from the data associated with the two-dimensional image. For instance, the image analysis engine can extract feature dimensions, circuit features, circuit feature size, circuit feature location, pattern defects, locations (e.g., relative and/or absolute) of edges within the image, critical dimensions, etc.

The SEM component can utilize the two-dimensional analysis in connection with any suitable feed forward and/or feedback control of the lithographic patterning process. For instance, the SEM component utilizing two-dimension analysis can provide this data in comparison with projected data and/or anticipated data in relation to circuit feature dimension and/or circuit feature placement. By analyzing and/or comparing such data, manipulations in the lithographic patterning process can be initiated.

In accordance with an aspect of the claimed subject matter, the image analysis engine can communicate with a data store. The data store can provide storage for at least one layout design pattern and/or any other suitable data. The image analysis engine can utilize the data store to make any suitable comparisons between the SEM-acquired two-dimensional image and the layout design pattern. By utilizing the data store, the comparisons can be accurate and/or improved to allow for a minimizing of error in the lithographic patterning process.

In accordance with one aspect of the claimed subject matter, the image analysis engine can provide the extracted information to an advanced process control (APC) engine. The APC engine can take as an input the measured values of key metrics of the SEM two-dimensional image and at least one target value for the substantially similar metrics. Based on these inputs, the APC engine can generate instructions for at least one of a downstream processing step involving a process component and an upstream processing step involving a process component.

In accordance with another aspect of the claimed subject matter, the APC engine can include an analyzer. The analyzer can ascertain whether a particular change and/or manipulation can be applied to the process, the process component, a process setting, a process configuration, and/or any combination thereof. For instance, the analyzer can determine whether or not a particular aspect of the extracted image is within a particular threshold, limit, and/or error percentage. Based at least in part upon the analyzer, an adjuster can adjust the process component to provide an optimized control for the semiconductor patterning process. In other aspects of the claimed subject matter, methods are provided that facilitate utilizing two-dimensional image analysis within a semiconductor patterning process and/or utilizing such analysis for feedback and/or feed forward control.

The following description and the annexed drawings set forth in detail certain illustrative aspects of the claimed subject matter. These aspects are indicative, however, of but a few of the various ways in which the principles of the innovation may be employed and the claimed subject matter is intended to include all such aspects and their equivalents. Other advantages and novel features of the claimed subject matter will become apparent from the following detailed description of the innovation when considered in conjunction with the drawings.

DETAILED DESCRIPTION

Figure 1:
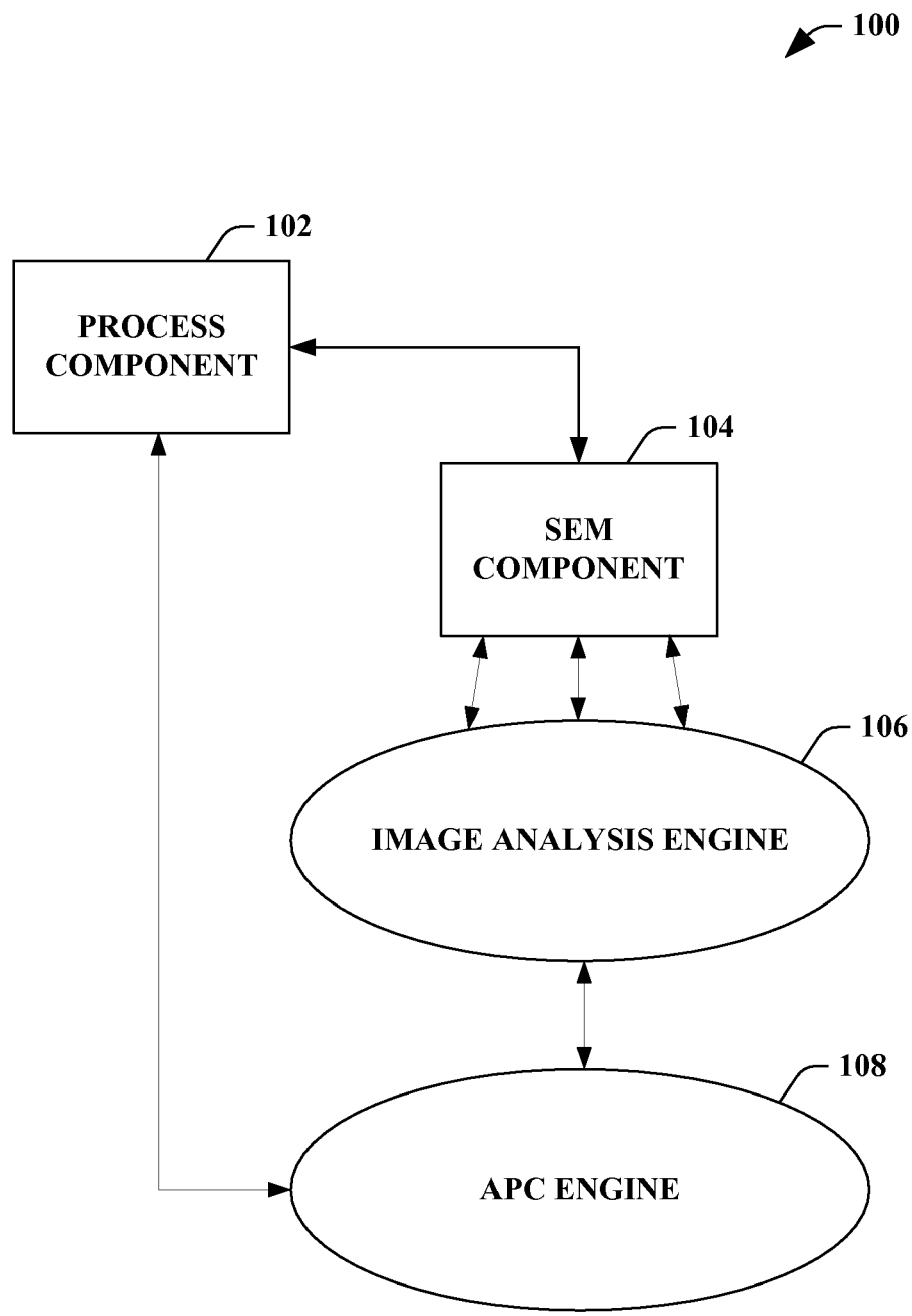
FIG. 1 illustrates a block diagram of an exemplary system that facilitates utilizing two-dimensional image analysis within an advanced process control framework to enhance resolution.

The claimed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the claimed subject matter may be practiced without these specific details. In other instances, well-known structures and devices are shown in block diagram form in order to facilitate describing the subject innovation.

As utilized herein, terms "component," "system," "interface," "engine," and the like are intended to refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the claimed subject matter. Moreover, the word "exemplary" is used herein to mean serving as an example, instance, or illustration. Any aspect or design described herein as "exemplary" is not necessarily to be construed as preferred or advantageous over other aspects or designs.

Now turning to the figures, FIG. 1 illustrates a system 100 that facilitates utilizing two-dimensional image analysis within an advanced process control framework to enhance resolution. A scanning electron microscope (SEM) component 104 (also referred to herein as the "SEM component") can provide image analysis of at least one circuit feature and/or item. The SEM component 104 can provide aggressive resolution enhancement techniques that require knowledge of not only the feature dimensions but also placement relative to other features associated with the circuit. It is to be appreciated and understood the SEM component 104 can be any suitable SEM and/or SEM tool and can provide a plurality of images in relation to the circuit feature and/or item. Furthermore, the SEM component 104 can employ two-dimensional analysis of the at least one circuit feature and/or item. The two-dimensional analysis implemented by the SEM component 104 can assure an aggressive resolution technique that provides accurate knowledge and/or data related to the circuit feature dimensions but also the placement of such features in relation to disparate features. The two-dimensional image(s) can be utilized further by a process component 102, wherein the process component 102 can be any suitable process component associated with at least one of advanced process control, lithographic patterning, image analysis, a critical dimension SEM (CD-SEM), resolution enhancements, etc.

The SEM component 104 can utilize the two-dimensional analysis in connection with any suitable feed forward and/or feedback control of the lithographic patterning process. For instance, the SEM component 104 utilizing two-dimension analysis can provide this data in comparison with projected data and/or anticipated data in relation to circuit feature dimension and/or circuit feature placement. By analyzing and/or comparing such data, manipulations in the lithographic patterning process can be initiated. It is to be assured that various thresholds, pre-defined limits, error percentages, and the like can be employed in addition to such feedback and/or feed forward control. In addition, the process component 102 can utilize the two-dimensional image and/or images for further processing associated with the system 100. In other words, the SEM component 104 can emphasize two-dimensional images and utilize such images within an advanced process control framework, wherein desired circuit patterns and/or design data can be compared to in-line manufacturing results.

The SEM component 104 can provide at least one image to an image analysis engine 106 that allows the two-dimensional image to be analyzed. The two-dimensional image can be analyzed by the SEM component 104 for the purpose of advanced process control of a semiconductor patterning process. The image analysis engine 106 can be any suitable collection of software, hardware, modules, components, and/or any combination thereof which can analyze the images to extract information from them. For example, the image analysis engine 106 can extract information such as, but not limited to, feature dimensions, pattern defects, locations (e.g., relative and/or absolute) of edges within the images, etc. As discussed infra, the image analysis engine 106 can communicate with a data store (not shown) to provide further comparative analysis.

The image analysis engine 106 can provide any extracted information from the two-dimensional image(s) and/or data analysis to an advanced process control (APC) engine 108 (also referred herein as the APC engine). The APC engine 108 can be any suitable collection of software, hardware, modules, components, and/or any combination thereof which can take the input measured values of key metrics for the SEM image (e.g., feature dimensions, pattern defects, locations (e.g., relative and/or absolute) of edges within the images, etc.) and target values for these substantially similar metrics. Based on such inputs, instructions can be generated for at least one of an upstream processing step, a downstream processing step, the process component 102, and/or any combination thereof. The system 100 can additionally employ such two-dimensional images and/or any analysis associated therewith to control components, modules, software, hardware, engines and/or operating parameters associated therewith.

It is to be understood the process component 102 can be, for instance, a control component that can be a processor dedicated to determining whether and to what extent a given parameter is beyond thresholds, limits, and error percentages. A processor can further be used to control one or more of the components of the APC system, or, alternatively, a processor that is both used to determine whether and to what extent a given parameter is beyond thresholds, limits, error percentages and to control one or more of the components of the APC system.

Figure 2:
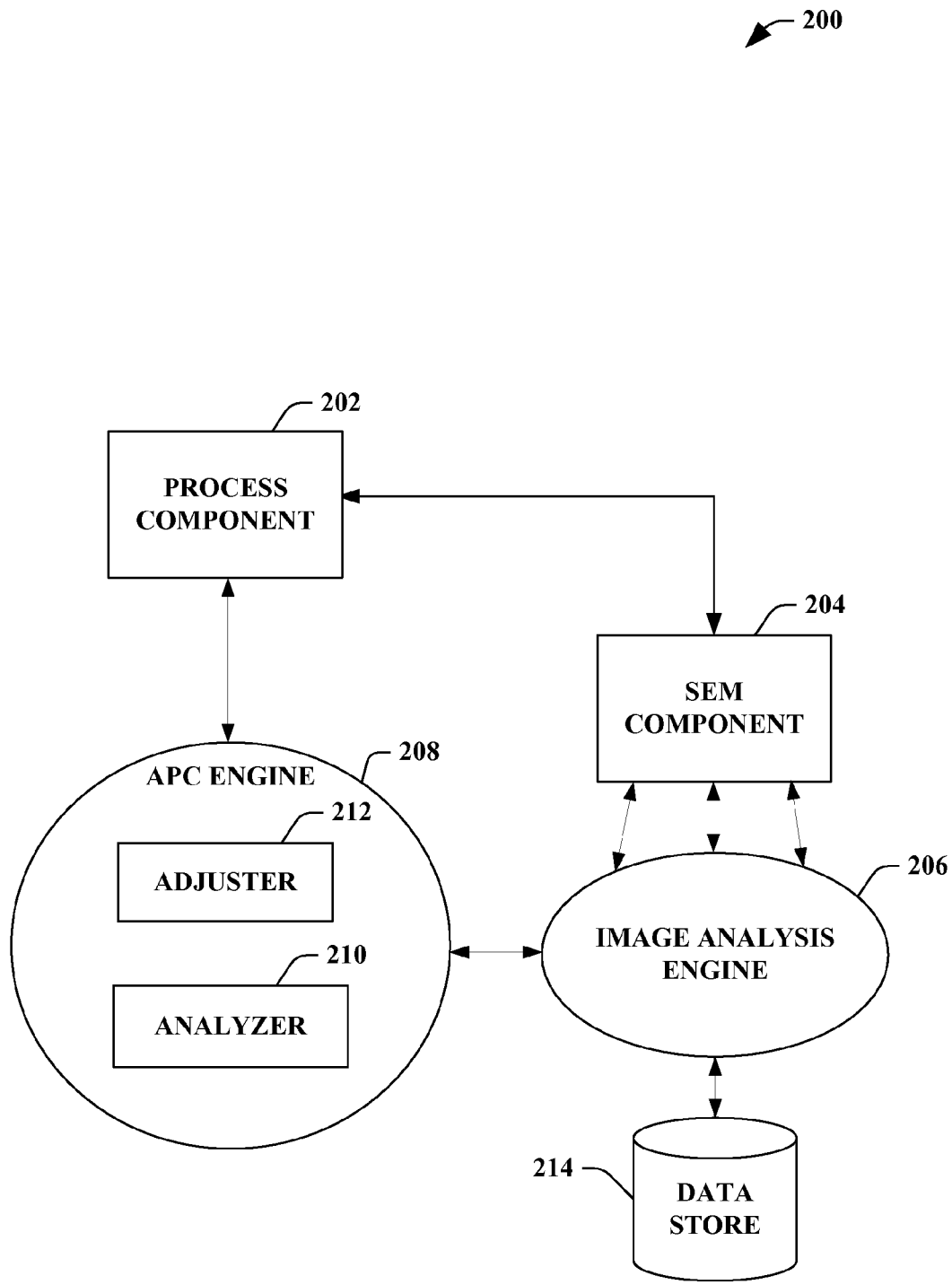
FIG. 2 illustrates a block diagram of an exemplary system that facilitates emphasizing a two-dimensional resolution technique within an advanced process control framework.

FIG. 2 illustrates a system 200 that facilitates emphasizing a two-dimensional resolution technique within an advanced process control framework. An SEM component 204 can provide at least one two-dimensional image of a circuit feature and/or item in relation to a semiconductor patterning process. Such image can be utilized by any suitable process component 202. The SEM component 204 can further provide at least one two-dimensional image to an image analysis engine 206 that can provide analysis associated therewith. In other words, the image analysis engine 206 can extract information from the two-dimensional image based at least in part upon the analysis provided. Such extracted information can be utilized by an APC engine 208. It is to be appreciated that the process component 202, the SEM component 204, the image analysis engine 206, and the APC engine 208 can be substantially similar to the components and/or engines described in previous figures.

The information (e.g., extracted data from at least one two-dimensional image) from the image analysis engine 206 can be received by an analyzer 210 associated with the APC engine 208. The analyzer 210 can further ascertain whether a particular change and/or manipulation to the process, the process component 202, a process setting, a process configuration, and/or any combination thereof. For instance, the analyzer 210 can determine whether or not a particular aspect of the extracted image is within a particular threshold, limit, and/or error percentage. Based at least in part upon the analyzer 210, an adjuster 212 can adjust the process component 202 to provide an optimized control for the semiconductor patterning process. For instance, the adjuster 212 can be any control component (e.g., hardware, software, and/or any combination thereof) that is capable of adjusting the system 200 based at least in part upon the two-dimensional image from the SEM component 204, the image analysis engine 206, the analyzer 210, and/or any combination thereof.

The data store 214 can store various data related to the system 200, such as, but not limited to, process component settings, process settings, configurations, historical data, usernames (e.g., to log any data changes and/or manipulations), layout design patterns, comparison historical data, limits, thresholds, error percentages, data related to a semiconductor patterning process, feedback settings, feed forward settings, etc. For instance, the data store 214 can include layout design patterns, wherein the image analysis engine 206 can communicate therewith to allow analysis and/or comparisons between the SEM-acquired image and the design pattern. The data store 214 can be, for example, either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable programmable ROM (EEPROM), or flash memory. The data store 214 of the subject systems and methods is intended to comprise, without being limited to, these and any other suitable types of memory. In addition, it is to be appreciated that the data store 214 can be a server, a database, a hard drive, and the like. Moreover, it is to be appreciated that any suitable data store, database (e.g., relational or otherwise), network, World Wide Web (WWW.), etc. can be utilized with the subject innovation and such examples are not to be so limiting. In addition, it is to be understood that any suitable connectivity to a data store, database (e.g., relational or otherwise), network, World Wide Web (WWW.), etc. can be employed.

Figure 3:
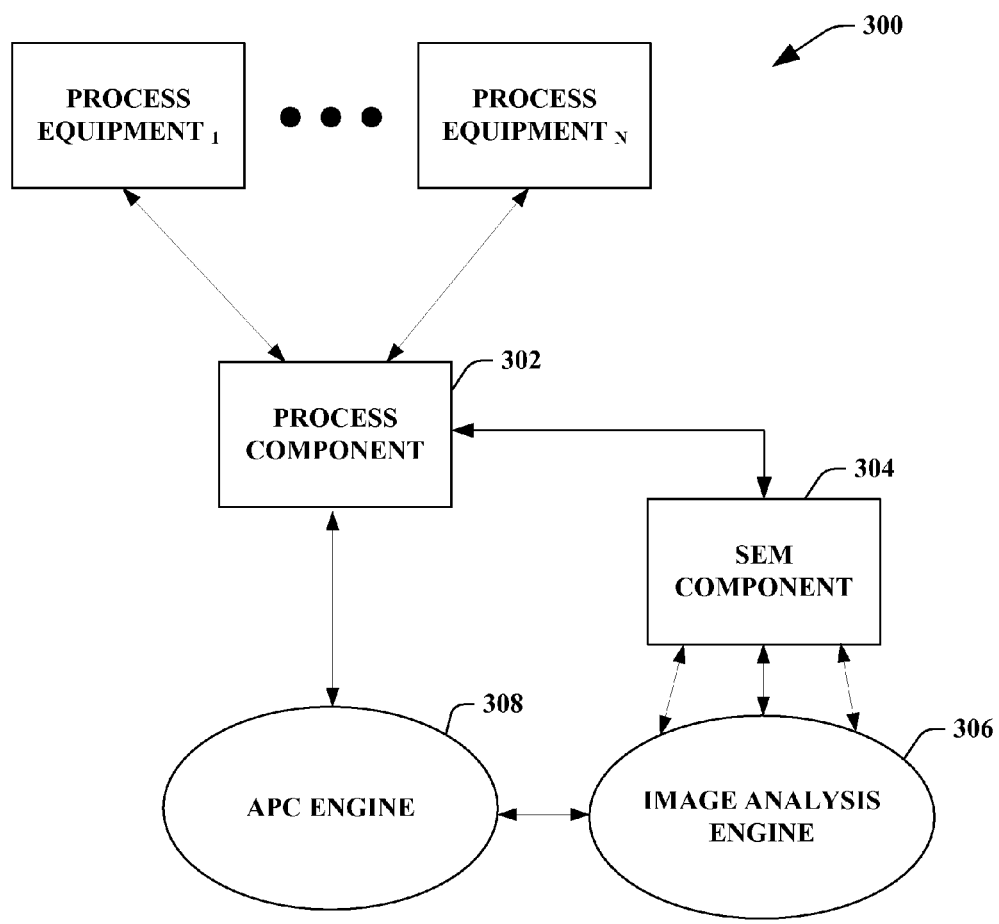
FIG. 3 illustrates a block diagram of an exemplary system that facilitates providing feedback and/or feed forward control in connection with an advanced process control framework.

FIG. 3 illustrates a system 300 that facilitates providing feedback and/or feed forward control in connection with an advanced process control framework. The system 300 includes a process component that can utilize a two-dimensional image provided by an SEM component 304. The SEM component 304 can provide an image in two-dimensions to analyze circuit feature sizes, circuit features, and/or circuit feature placement. The two-dimensional image can be further examined and/or analyzed by an image analysis engine 306. The image analysis engine 306 can provide various determinations and/or extract information such as, but not limited to, feature dimensions, pattern defects, location of edges within the image, etc. Moreover, the extracted information can be further utilized by an APC engine 308 that can generate instructions and/or invoke manipulations to a process component 302.

As illustrated, it is to be appreciated that there can any number of process equipment affected by the instructions and/or manipulations generated based on the two-dimensional image and/or analysis related thereto. For instance, there can be any number of process equipment such as process equipment 1 to process equipment N, wherein N is an integer greater than or equal to 1. Moreover, the process component 302 can be related to any suitable process equipment associated with a semiconductor patterning process.

Figure 4:
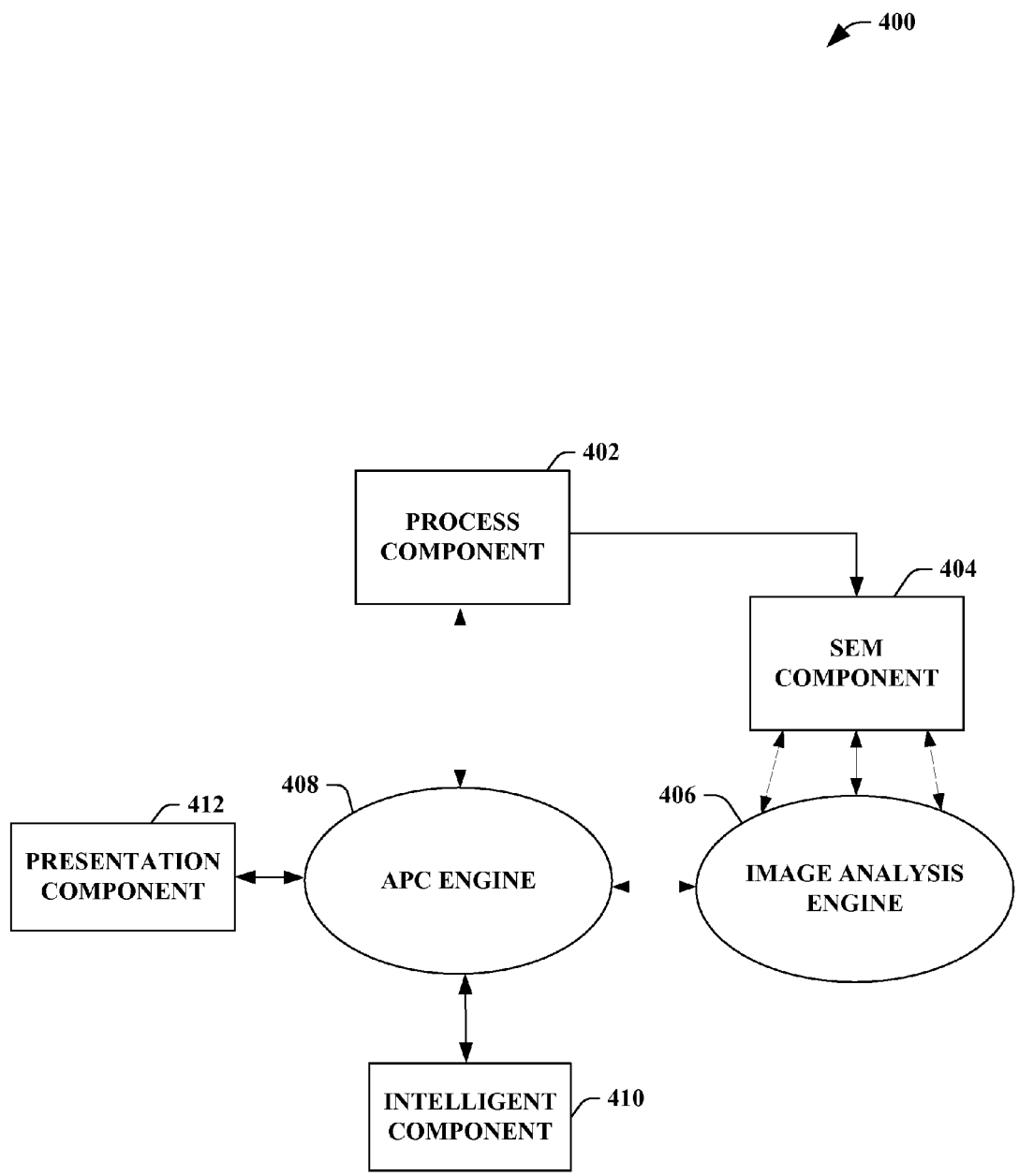
FIG. 4 illustrates a block diagram that facilitates utilizing two-dimensional image analysis within an advanced process control framework to enhance resolution.

FIG. 4 illustrates a system 400 that facilitates utilizing two-dimensional image analysis within an advanced process control framework to enhance resolution. The system 400 can include a process component 402, an SEM component 404, an image analysis engine 406, and an APC engine 408 that can all be substantially similar to respective components, components and engines described in previous figures. The system 400 further includes an intelligent component 410. The intelligent component 410 can be utilized by the APC engine to facilitate utilizing two-dimensional image analysis. Although the intelligent component 410 is depicted as being associated with the APC engine 408, it is to be appreciated that any component and/or engine can employ the intelligent component 410. For example, the intelligent component 410 can infer a process change, a manipulation to a process component, a setting change, thresholds, corrective procedures based on analysis of the two-dimensional image, SEM component settings, corrective measures in advanced process control based on historical performance and/or data, etc.

It is to be understood that the intelligent component 410 can provide for reasoning about or infer states of the system, environment, and/or user from a set of observations as captured via events and/or data. It is to be appreciated that the following techniques are solely for example and the claimed subject matter is not so limited. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification (explicitly and/or implicitly trained) schemes and/or systems (e.g., support vector machines, neural networks, expert systems, Bayesian belief networks, fuzzy logic, data fusion engines . . . ) can be employed in connection with performing automatic and/or inferred action in connection with the claimed subject matter.

A classifier is a function that maps an input attribute vector, $x=(x1, x2, x3, x4, xn)$, to a confidence that the input belongs to a class, that is, $f(x)=confidence(class)$. Such classification can employ a probabilistic and/or statistical-based analysis (e.g., factoring into the analysis utilities and costs) to prognose or infer an action that a user desires to be automatically performed. A support vector machine (SVM) is an example of a classifier that can be employed. The SVM operates by finding a hypersurface in the space of possible inputs, which hypersurface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

The system 400 can further utilize a presentation component 412 that provides various types of user interfaces to facilitate interaction between a user and any component within the system 400. As depicted, the presentation component 412 is a separate entity that can be utilized with the APC engine 408. However, it is to be appreciated that the presentation component 412 and/or similar view components can be incorporated into the APC engine 408, any component within the system 400, and/or a stand-alone unit. The presentation component 412 can provide one or more graphical user interfaces (GUIs), command line interfaces, and the like. For example, a GUI can be rendered that provides a user with a region or means to load, import, read, etc., data, and can include a region to present the results of such. These regions can comprise known text and/or graphic regions comprising dialogue boxes, static controls, drop-down-menus, list boxes, pop-up menus, as edit controls, combo boxes, radio buttons, check boxes, push buttons, and graphic boxes. In addition, utilities to facilitate the presentation such as vertical and/or horizontal scroll bars for navigation and toolbar buttons to determine whether a region will be viewable can be employed. For example, the user can interact with one or more of the components coupled and/or incorporated into the APC engine 408.

The user can also interact with the regions to select and provide information via various devices such as a mouse, a roller ball, a keypad, a keyboard, a pen and/or voice activation, for example. Typically, a mechanism such as a push button or the enter key on the keyboard can be employed subsequent entering the information in order to initiate the search. However, it is to be appreciated that the claimed subject matter is not so limited. For example, merely highlighting a check box can initiate information conveyance. In another example, a command line interface can be employed. For example, the command line interface can prompt (e.g., via a text message on a display and an audio tone) the user for information via providing a text message. The user can than provide suitable information, such as alpha-numeric input corresponding to an option provided in the interface prompt or an answer to a question posed in the prompt. It is to be appreciated that the command line interface can be employed in connection with a GUI and/or API. In addition, the command line interface can be employed in connection with hardware (e.g., video cards) and/or displays (e.g., black and white, and EGA) with limited graphic support, and/or low bandwidth communication channels.

Figure 5:
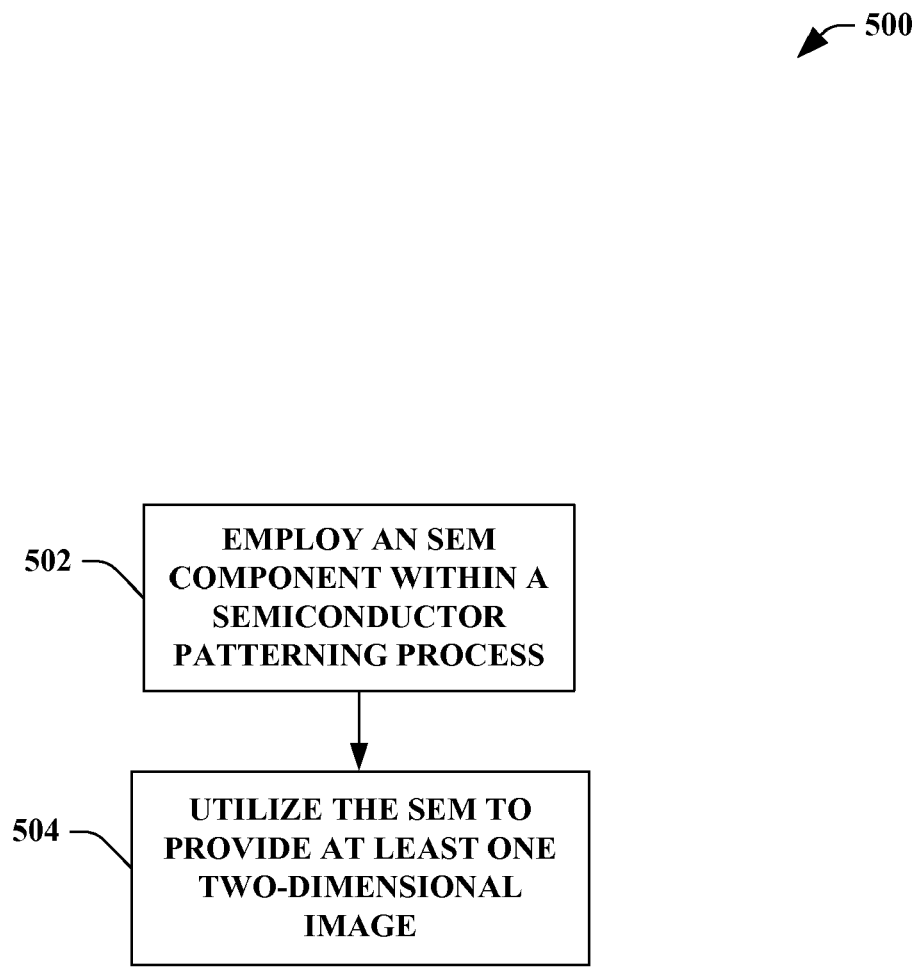
FIG. 5 illustrates an exemplary methodology that facilitates emphasizing a two-dimensional resolution technique within an advanced process control framework.
Figure 6:
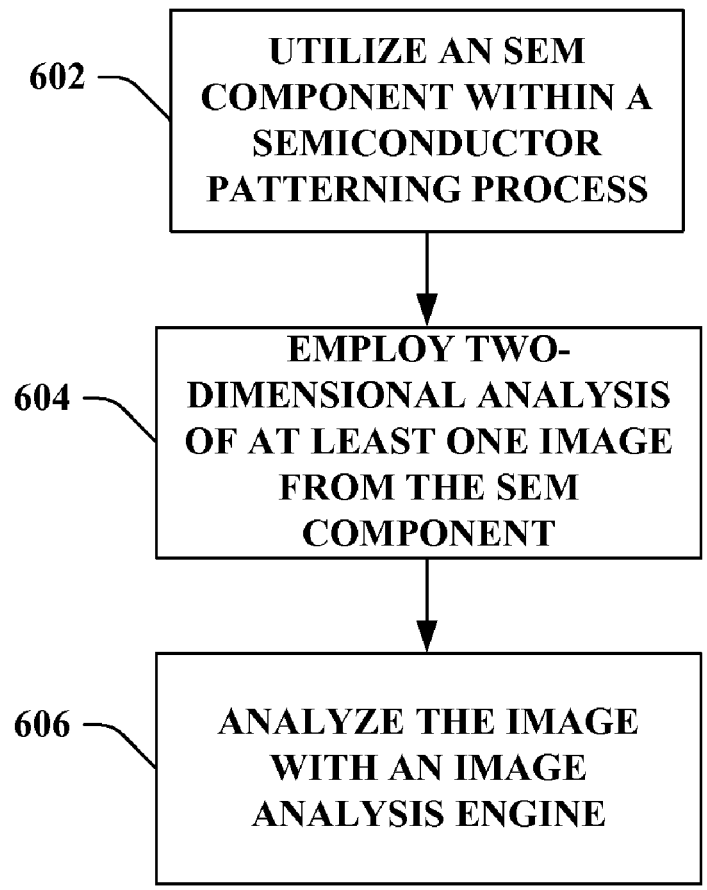
FIG. 6 illustrates an exemplary methodology that facilitates employing two-dimensional image analysis within an advanced process control framework.
Figure 7:
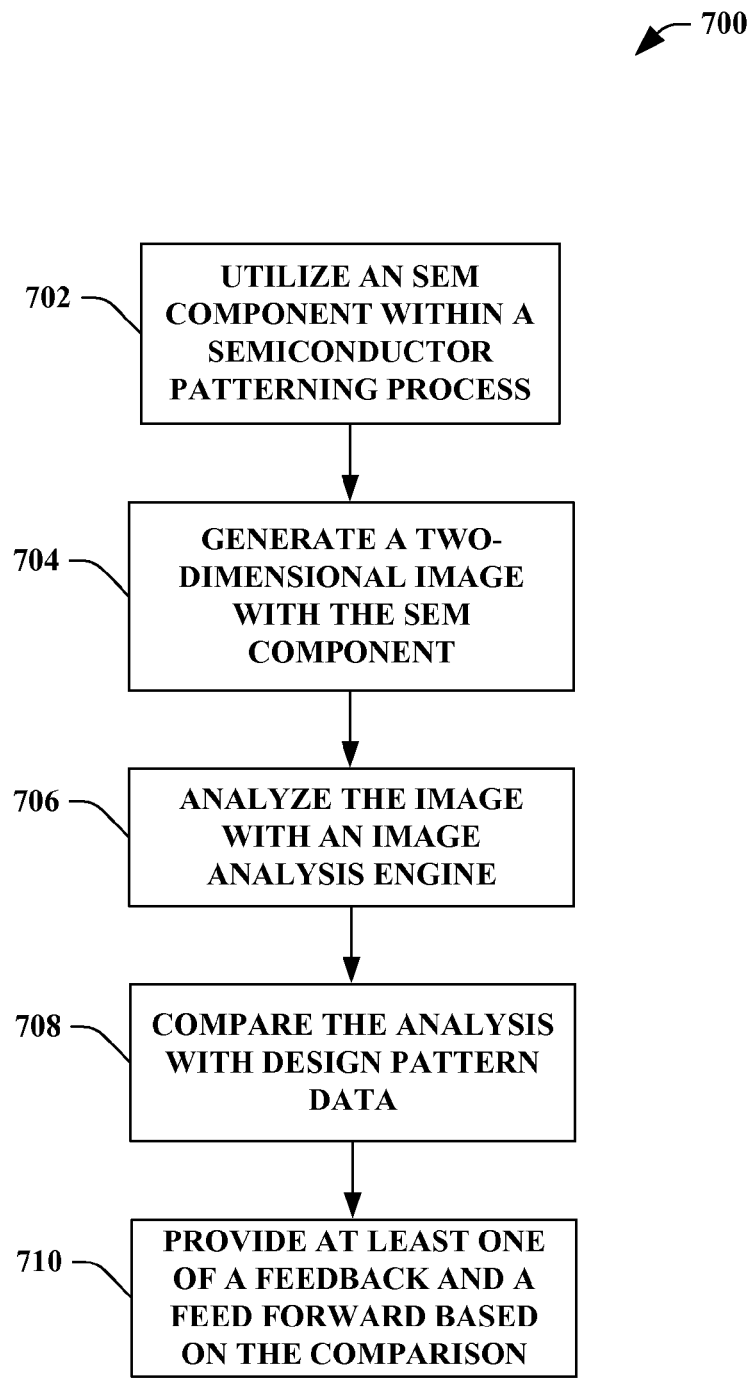
FIG. 7 illustrates an exemplary methodology for providing an aggressive and enhanced resolution technique associated with two-dimensional analysis.

FIGS. 5-7 illustrate methodologies in accordance with the claimed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the claimed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

FIG. 5 illustrates a methodology 500 that facilitates emphasizing a two-dimensional resolution technique within an advanced process control framework. At reference numeral 502, an SEM component can be employed within a semiconductor patterning process. The SEM component can be any suitable scanning electron microscope that can provide image analysis in relation to circuit feature size, circuit features, and/or circuit feature placement. Moreover, the SEM component can be utilized to provide resolution enhancement techniques in connection with the lithographic patterning process. At reference numeral 504, the SEM can be utilized to provide at least one two-dimensional image of a circuit feature and/or a circuit item. The two-dimensional image can provide a more aggressive resolution enhancement technique that allows for the accurate knowledge of a feature dimension and/or a feature placement relative to other features. Moreover, the two-dimensional approach can be integrated within an advanced process control framework.

FIG. 6 illustrates a methodology 600 that facilitates employing two-dimensional image analysis within an advanced process control framework. At reference numeral 602, a scanning electron microscope (SEM) component can be utilized within a semiconductor patterning process. The SEM component can be utilized to provide image analysis and/or provide data related to circuit features, critical dimensions, circuit feature placement, and the like.

At reference numeral 604, the SEM component can be utilized to employ a two-dimensional image and analysis associated therewith for at least one image. The two-dimensional image and analysis of the at least one image can provide accurate knowledge of circuit features, circuit dimensions, circuit feature placement in relation to other circuit features, critical dimensions, and the like. At reference numeral 606, the two-dimensional image can be analyzed with an image analysis engine. The image analysis engine can extract information from the two-dimensional image(s) such as, but not limited to, feature dimensions, pattern defects, location of edges within the image, feature dimension placement, critical dimensions, etc.

FIG. 7 illustrates a methodology 700 for providing an aggressive and enhanced resolution technique associated with two-dimensional analysis. At reference numeral 702, an SEM component can be utilized within a semiconductor patterning process. The SEM component can be any suitable scanning electron microscope utilized to provide images in relation to a lithographic process. At reference numeral 704, two-dimensional image is generated by the SEM component. Continuing at reference numeral 706, the two-dimensional image can be analyzed with an image analysis engine. The image analysis engine can extract data and/or other suitable information from the two-dimensional image such as, but not limiting to, feature dimensions, pattern defects, location of edges within the image, feature dimension placement, critical dimensions, etc.

At reference numeral 708, the results from the image analysis engine can be compared with design pattern data. For instance, the design pattern data can be the optimized goal and/or end-product anticipated. Thus, the two-dimensional image can be compared with the design pattern data to determine and/or ascertain any disparities, differences, and/or errors. In one example, the comparison can be invoked by utilizing a data store that can store any relevant design pattern data. At reference numeral 710, the comparison can be utilized to provide at least one of a feedback and a feed forward control to at least one process component. For example, the comparison can be utilized to generate an instruction associated with a downstream processing step (e.g., feed forward control) and/or an upstream processing step (e.g., feedback control) with the goal of minimizing the difference between measured and target pattern metrics in subsequent processing.

Figure 8:
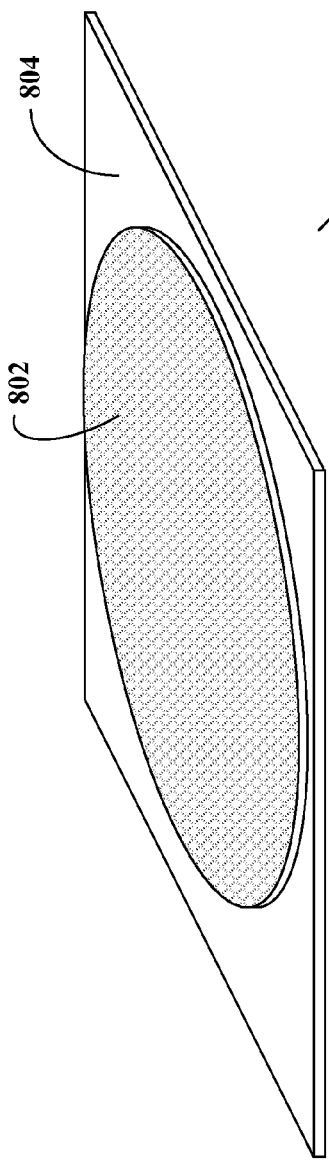
FIG. 8 illustrates a perspective view of a grid-mapped wafer according to one or more aspects of the present invention.
Figure 9:
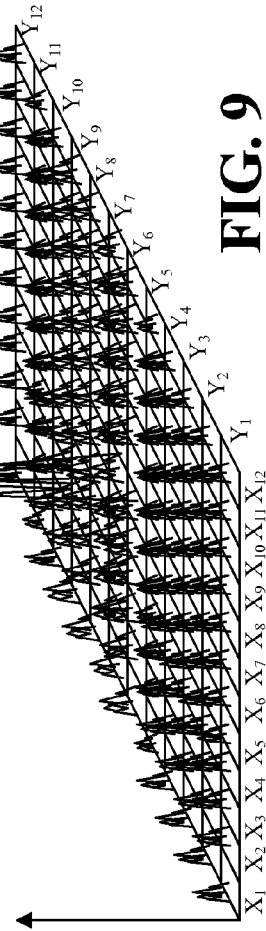
FIG. 9 illustrates plots of measurements taken at grid-mapped locations on a wafer in accordance with one or more aspects of the present invention.
Figure 10:
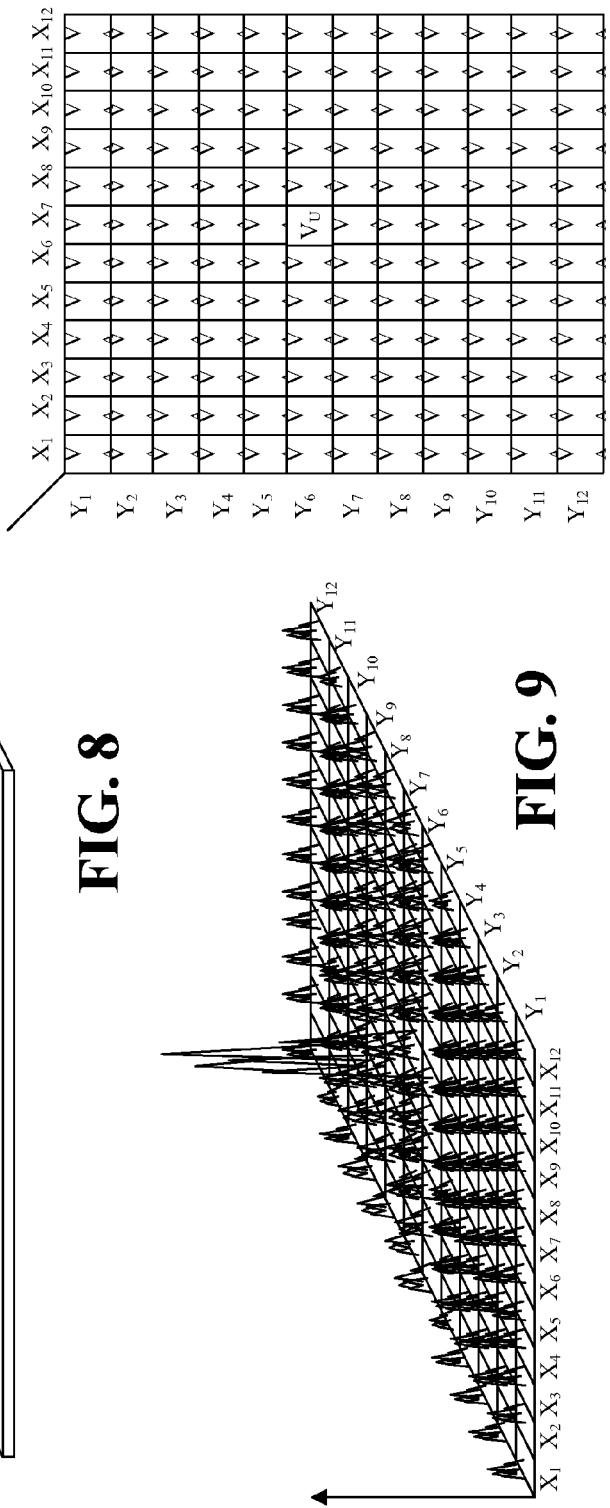
FIG. 10 illustrates a table containing entries corresponding to measurements taken at respective grid-mapped locations on a wafer in accordance with one or more aspects of the present invention.

Turning now to FIGS. 8-10, in accordance with one or more aspects of the present innovation, a wafer 802 (or one or more die located thereon) situated on a stage 804 can be logically partitioned into grid blocks to facilitate concurrent measurements of critical dimensions and overlay as the wafer matriculates through a semiconductor fabrication process. This can facilitate selectively determining to what extent, if any, fabrication adjustments are necessary. Obtaining such information can also assist in determining problem areas associated with fabrication processes.

FIG. 8 illustrates a perspective view of the steppable stage 804 supporting the wafer 802. The wafer 802 can be divided into a grid pattern as shown in FIG. 8. Each grid block (XY) of the grid pattern corresponds to a particular portion of the wafer 802 (e.g., a die or a portion of a die). The grid blocks are individually monitored for fabrication progress by concurrently measuring critical dimensions and overlay with either scatterometry or scanning electron microscope (SEM) techniques.

This can also be applicable in order to assess wafer-to-wafer and lot-to-lot variations. For example, a portion P (not shown) of a first wafer (not shown) can be compared to the corresponding portion P (not shown) of a second wafer. Thus, deviations between wafers and lots can be determined in order to calculate adjustments to the fabrication components that are necessary to accommodate for the wafer-to-wafer and/or lot-to-lot variations.

In FIG. 9, one or more respective portions of the wafer 802 ($X_1Y_1 \ldots X_{12}, Y_{12}$) are concurrently monitored for critical dimensions and overlay utilizing either scatterometry or scanning electron microscope techniques. Exemplary measurements produced during fabrication for each grid block are illustrated as respective plots. The plots can, for example, be composite valuations of signatures of critical dimensions and overlay. Alternatively, critical dimensions and overlay values can be compared separately to their respective tolerance limits.

As can be seen, the measurement at coordinate $X_7Y_6$ yields a plot that is substantially higher than the measurement of the other portions XY. This can be indicative of overlay, overlay error, and/or one or more critical dimension(s) outside of acceptable tolerances. As such, fabrication components and/or operating parameters associated therewith can be adjusted accordingly to mitigate repetition of this aberrational measurement. It is to be appreciated that the wafer 802 and or one or more die located thereon can be mapped into any suitable number and/or arrangement of grid blocks to effectuate desired monitoring and control.

FIG. 10 is a representative table of concurrently measured critical dimensions and overlay taken at various portions of the wafer 802 mapped to respective grid blocks. The measurements in the table can, for example, be amalgams of respective critical dimension and overlay signatures. As can be seen, all the grid blocks, except grid block $X_7Y_6$, have measurement values corresponding to an acceptable value ($V_A$) (e.g., no overlay error is indicated and/or overlay measurements and critical dimensions are within acceptable tolerances), while grid block $X_7Y_6$ has an undesired value ($V_U$) (e.g., overlay and critical dimensions are not within acceptable tolerances, thus at least an overlay or CD error exists). Thus, it has been determined that an undesirable fabrication condition exists at the portion of the wafer 802 mapped by grid block $X_7Y_6$. Accordingly, fabrication process components and parameters can be adjusted as described herein to adapt the fabrication process accordingly to mitigate the reoccurrence or exaggeration of this unacceptable condition.

Alternatively, a sufficient number of grid blocks can have desirable thickness measurements so that the single offensive grid block does not warrant scrapping the entire wafer. It is to be appreciated that fabrication process parameters can be adapted so as to maintain, increase, decrease and/or qualitatively change the fabrication of the respective portions of the wafer 802 as desired. For example, when the fabrication process has reached a pre-determined threshold level (e.g., X % of grid blocks have acceptable CDs and no overlay error exists), a fabrication step can be terminated.

Figure 11:
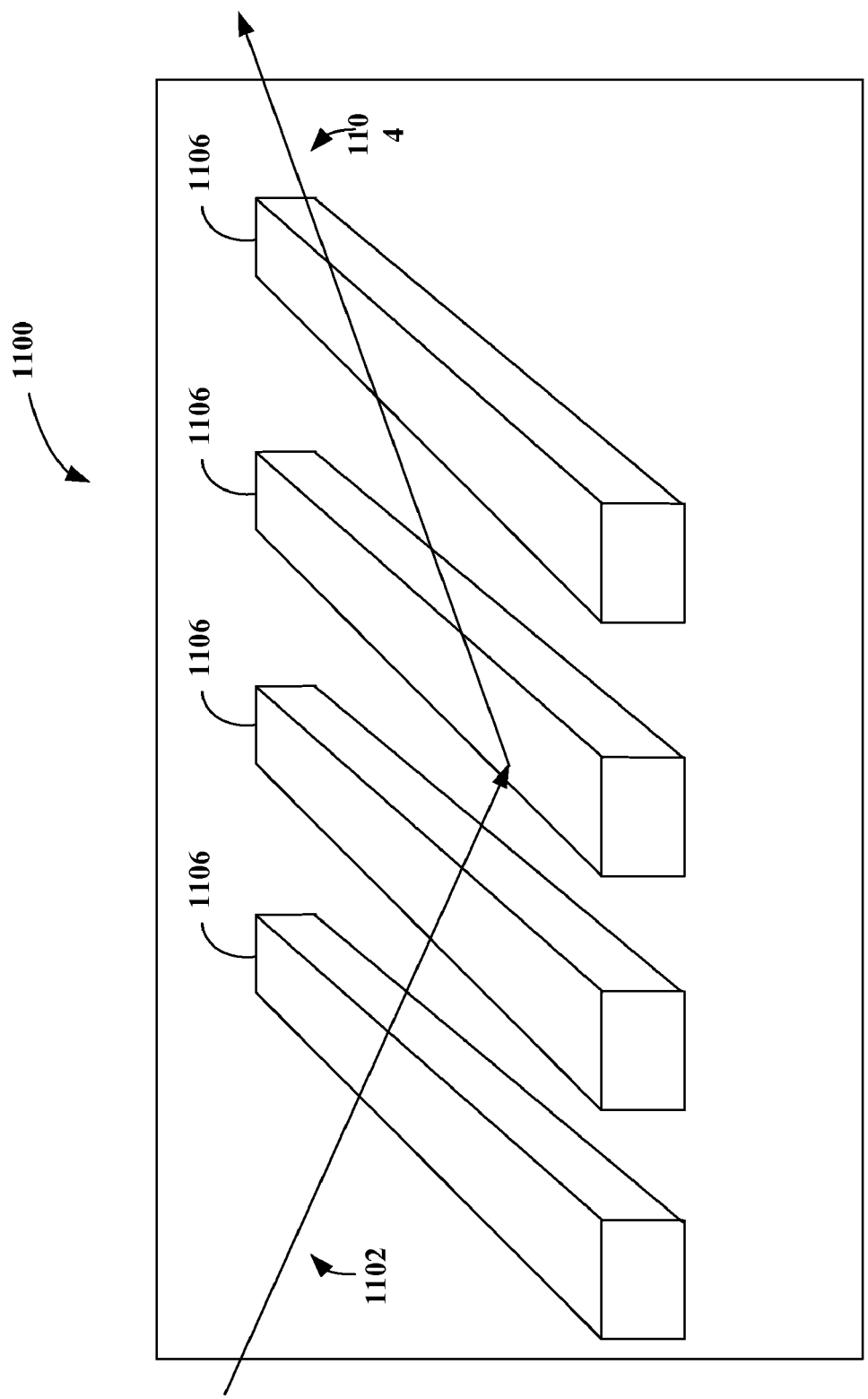
FIG. 11 is a simplified perspective view of an incident light reflecting off a surface in accordance with one or more aspects of the present invention.
Figure 12:
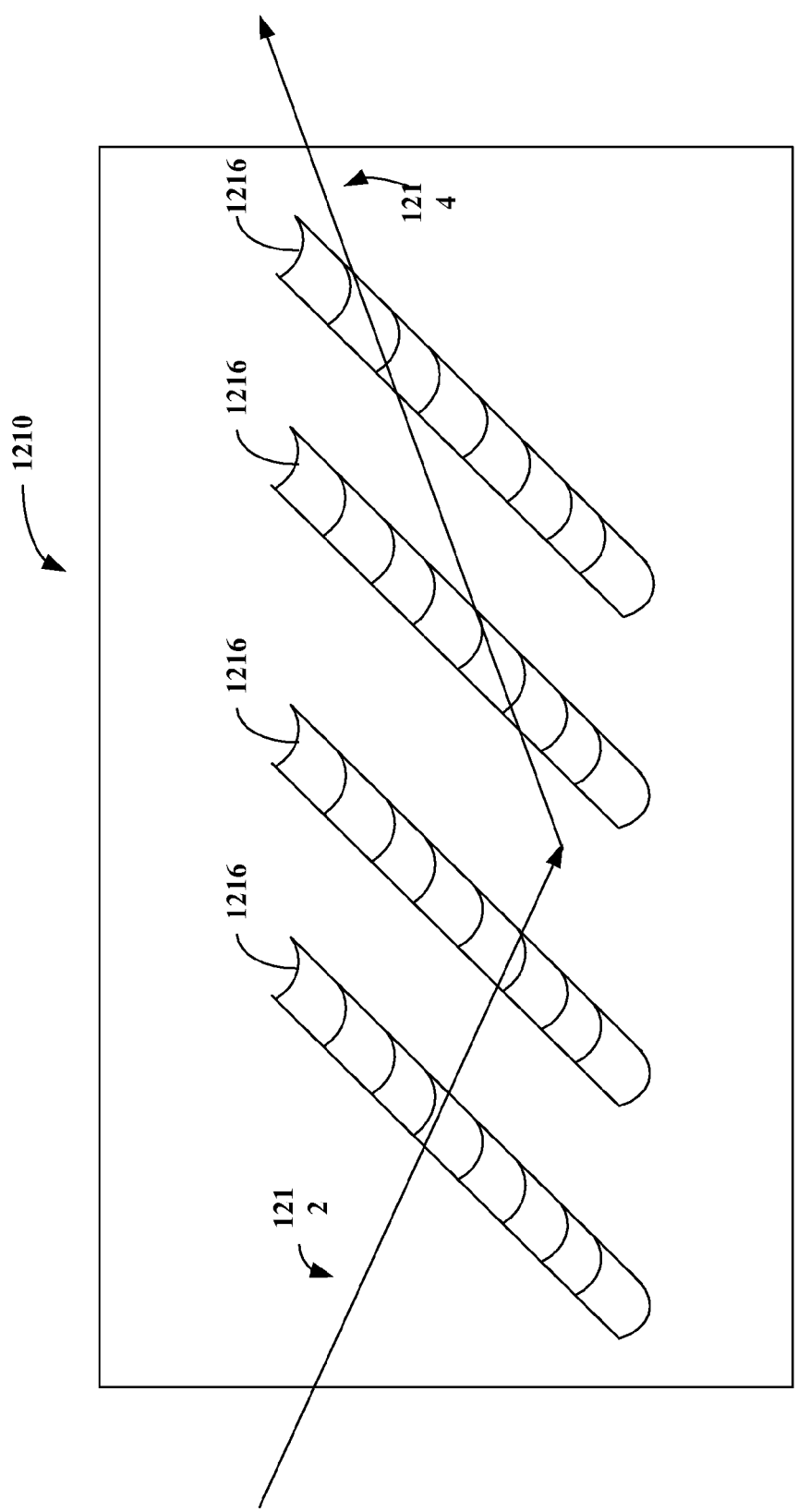
FIG. 12 is a simplified perspective view of an incident light reflecting off a surface in accordance with one or more aspects of the present invention.

To illustrate the principles described above, and to detail the advantages of employing scatterometry techniques in conjunction with aspects of the subject innovation, reference is now made to FIGS. 11 and 12. Referring initially to FIG. 11, an incident light 1102 is directed at a surface 1100, upon which one or more features 1106 may exist. In FIG. 11 the incident light 1102 is reflected as reflected light 1104. The incident light 1102 and/or reflected light 1104 can propagate through an immersion medium (not shown). The properties of the surface 1100, including but not limited to, thickness, uniformity, planarity, chemical composition and the presence of features, can affect the reflected light 1104. In FIG. 11, the features 1106 are raised upon the surface 1100. The phase of the reflected light 1104 can be plotted, as can the intensity of the reflected light 1104. Such plots can be employed in connection with known grating structures built upon the surface to compare measured signals with signatures stored in a signature library in a memory using techniques such as pattern matching, for example.

Referring now to FIG. 12, incident light 1212 is directed onto a surface 1210 upon which one or more depressions 1216 appear. The incident light 1212 is reflected as reflected light 1214. Like the one or more features 1106 (FIG. 11) may affect an incident beam, so too may the one or more depressions 1216 affect an incident beam. Thus, it is to be appreciated that scatterometry can be employed to measure features appearing on a surface, features appearing in a surface, and properties of a surface itself, regardless of features.

Figure 13:
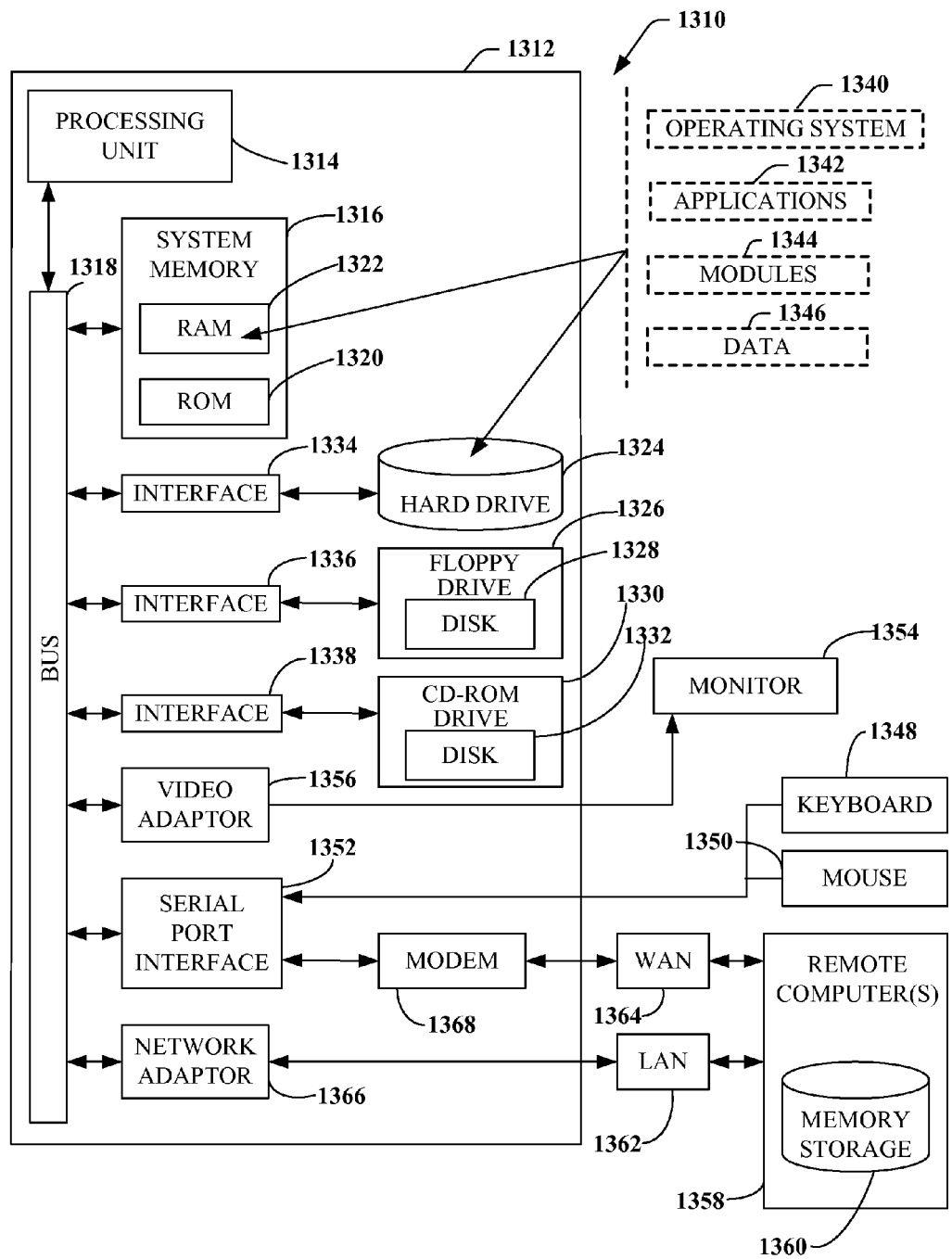
FIGS. 13 and 14 illustrate exemplary computing systems and/or environments in connection with facilitating employment of the subject invention.
Figure 14:
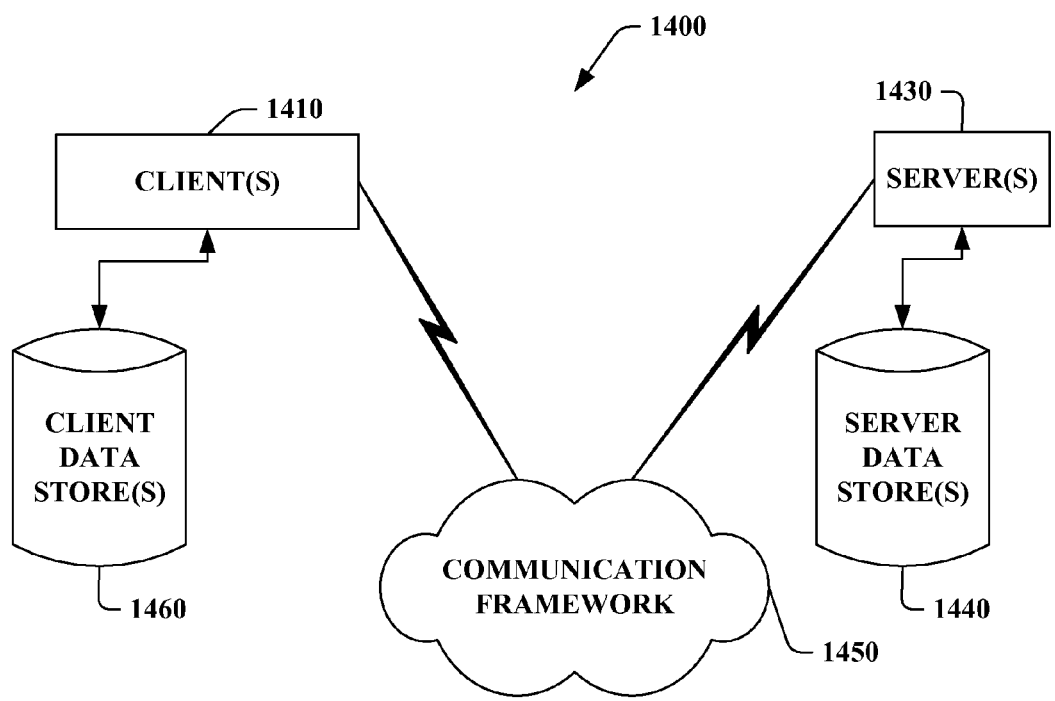

In order to provide a context for the various aspects of the innovation, FIGS. 13 and 14 as well as the following discussion are intended to provide a brief, general description of a suitable computing environment in which the various aspects of the subject innovation can be implemented. While the innovation has been described above in the general context of computer-executable instructions of a computer program that runs on a computer and/or computers, those skilled in the art will recognize that the innovation also can be implemented in combination with other program modules. Generally, program modules include routines, programs, components, data structures, etc. that perform particular tasks and/or implement particular abstract data types. Moreover, those skilled in the art will appreciate that the inventive methods can be practiced with other computer system configurations, including single-processor or multiprocessor computer systems, mini-computing devices, mainframe computers, as well as personal computers, hand-held computing devices, microprocessor-based or programmable consumer electronics, and the like. The illustrated aspects of the innovation can also be practiced in distributed computing environments where tasks are performed by remote processing devices that are linked through a communications network. However, some, if not all, aspects of the innovation can be practiced on stand-alone computers. In a distributed computing environment, program modules can be located in both local and remote memory storage devices.

With reference to FIG. 13, an exemplary environment 1310 for implementing various aspects of the innovation includes a computer 1312. The computer 1312 includes a processing unit 1314, a system memory 1316, and a system bus 1318. The system bus 1318 couples system components including, but not limited to, the system memory 1316 to the processing unit 1314. The processing unit 1314 can be any of various available processors. Dual microprocessors and other multiprocessor architectures also can be employed as the processing unit 1314.

The system bus 1318 can be any of several types of bus structure(s) including the memory bus or memory controller, a peripheral bus or external bus, and/or a local bus utilizing any variety of available bus architectures including, but not limited to, 8-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCM-CIA), and Small Computer Systems Interface (SCSI).

The system memory 1316 includes volatile memory 1320 and nonvolatile memory 1322. The basic input/output system (BIOS), comprising the basic routines to transfer information between elements within the computer 1312, such as during start-up, is stored in nonvolatile memory 1322. By way of illustration, and not limitation, nonvolatile memory 1322 can include read only memory (ROM), programmable ROM (PROM), electrically programmable ROM (EPROM), electrically erasable ROM (EEPROM), or flash memory. Volatile memory 1320 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 1312 also includes removable/non-removable, volatile/non-volatile computer storage media. FIG. 13 illustrates, for example a disk storage 1324. Disk storage 1324 includes, but is not limited to, devices like a magnetic disk drive, floppy disk drive, tape drive, Jaz drive, Zip drive, LS-100 drive, flash memory card, or memory stick. In addition, disk storage 1324 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1324 to the system bus 1318, a removable or non-removable interface is typically used such as interface 1326.

It is to be appreciated that FIG. 13 describes software that acts as an intermediary between users and the basic computer resources described in suitable operating environment 1310. Such software includes an operating system 1328. Operating system 1328, which can be stored on disk storage 1324, acts to control and allocate resources of the computer system 1312. System applications 1330 take advantage of the management of resources by operating system 1328 through program modules 1332 and program data 1334 stored either in system memory 1316 or on disk storage 1324. It is to be appreciated that the subject innovation can be implemented with various operating systems or combinations of operating system.

A user enters commands or information into the computer 1312 through input device(s) 1336. Input devices 1336 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1314 through the system bus 1318 via interface port(s) 1338. Interface port(s) 1338 include, for example, a serial port, a parallel port, a game port, and a universal serial bus (USB). Output device(s) 1340 use some of the same type of ports as input device(s) 1336. Thus, for example, a USB port can be used to provide input to computer 1312, and to output information from computer 1312 to an output device 1340. Output adapter 1342 is provided to illustrate that there are some output devices 1340 like monitors, speakers, and printers, among other output devices 1340, which require special adapters. The output adapters 1342 include, by way of illustration and not limitation, video and sound cards that provide a means of connection between the output device 1340 and the system bus 1318. It should be noted that other devices and/or systems of devices provide both input and output capabilities such as remote computer(s) 1344.

Computer 1312 can operate in a networked environment utilizing logical connections to one or more remote computers, such as remote computer(s) 1344. The remote computer (s) 1344 can be a personal computer, a server, a router, a network PC, a workstation, a microprocessor based appliance, a peer device or other common network node and the like, and typically includes many or all of the elements described relative to computer 1312. For purposes of brevity, only a memory storage device 1346 is illustrated with remote computer(s) 1344. Remote computer(s) 1344 is logically connected to computer 1312 through a network interface 1348 and then physically connected via communication connection 1350. Network interface 1348 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1350 refers to the hardware/software employed to connect the network interface 1348 to the bus 1318. While communication connection 1350 is shown for illustrative clarity inside computer 1312, it can also be external to computer 1312. The hardware/software necessary for connection to the network interface 1348 includes, for exemplary purposes only, internal and external technologies such as, modems including regular telephone grade modems, cable modems and DSL modems, ISDN adapters, and Ethernet cards.

FIG. 14 is a schematic block diagram of a sample-computing environment 1400 with which the subject innovation can interact. The system 1400 includes one or more client(s) 1410. The client(s) 1410 can be hardware and/or software (e.g., threads, processes, computing devices). The system 1400 also includes one or more server(s) 1430. The server(s) 1430 can also be hardware and/or software (e.g., threads, processes, computing devices). The servers 1430 can house threads to perform transformations by employing the subject innovation, for example. One possible communication between a client 1410 and a server 1430 can be in the form of a data packet adapted to be transmitted between two or more computer processes. The system 1400 includes a communication framework 1450 that can be employed to facilitate communications between the client(s) 1410 and the server(s) 1430. The client(s) 1410 are operably connected to one or more client data store(s) 1460 that can be employed to store information local to the client(s) 1410. Similarly, the server(s) 1430 are operably connected to one or more server data store(s) 1440 that can be employed to store information local to the servers 1430.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the subject innovation is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system that facilitates utilizing a resolution enhancement for a circuit feature, comprising:
    a scanning electron microscope (SEM) component that provides a two-dimensional image of the circuit feature;
    an image analysis engine that extracts circuit feature information from the two-dimensional image;
    an advanced process control (APC) engine that generates at least one instruction for at least one of a feed forward control or a feedback control based at least in part on the extracted circuit feature information and an inference derived from finding a hyper-surface in previously persisted sets of extracted circuit feature information; and
    a process component that utilizes the at least one instruction to minimize an error.

2. The system of claim 1, the SEM component is utilized in advanced process control of a semiconductor patterning process.

3. The system of claim 1, further comprising an intelligent component that infers one or more corrective measures for advanced process control based at least in part on historical performance data, the APC engine utilizes the corrective measures in generating the at least one instruction.

4. The system of claim 1, the SEM component provides at least one two-dimensional image of at least one of the following: a circuit feature size; a circuit feature dimension; a circuit feature placement in relation to a disparate circuit feature; a critical dimension; a defect; an edge location; or a pattern defect.

5. The system of claim 1, the extracted circuit feature information relates to a relative location of one or more edges of the circuit feature.

6. The system of claim 1, the extracted circuit feature information relates to a pattern defect of the circuit feature.

7. The system of claim 1, the image analysis engine is at least one of a software, a hardware, a module, or a component.

8. The system of claim 1, the image analysis engine communicates with a data store.

9. The system of claim 8, the data store includes at least one layout design pattern.

10. The system of claim 9, the image analysis engine compares the two-dimensional image with the layout design pattern to ascertain at least one difference.

11. The system of claim 1, the APC engine is at least one of a software; a hardware; a module; or a component.

12. The system of claim 1, the APC engine takes as input at least one of a measure value of a key metric of the two-dimensional image from the SEM component or a target value for the key metric.

13. The system of claim 12, the measure value is at least one of a feature dimension, a pattern defect, a location of an edge within the two-dimensional image, a relative location of an edge within the two-dimensional image, an absolute location of an edge within the two-dimensional image, a critical dimension, a defect, or information related to a circuit feature.

14. The system of claim 12, the APC engine generates an instruction based on the measure value of the key metric and the target value for the key metric for at least one of a downstream processing step or an upstream processing step.

15. The system of claim 14, the APC engine creates an instruction for at least one of feedback control for the process component or a feed forward control for the process component.

16. The system of claim 15, the APC engine minimizes the difference between the measure value of the key metric and the target value for the key metric in a subsequent semiconductor pattern processing.

17. A machine-implemented method that facilitates implementing a semiconductor pattern process, comprising:
    employing a scanning electron microscope (SEM) within the semiconductor pattern process;
    utilizing the SEM to provide at least one two-dimensional image of a circuit feature;
    extracting circuit feature information from the two-dimensional image;
    employing an advanced process control (APC) engine within the semiconductor pattern process; and
    utilizing the APC engine to generate at least one instruction for at least one of a downstream processing step, an upstream processing step, or any combination thereof, based at least in part on the circuit feature information and an inference based on ascertaining a pattern of independence between the circuit feature information and a set of model circuit feature information.

18. The method of claim 17, further comprising:
    comparing the extracted circuit feature information to a layout design pattern.

19. The method of claim 18, further comprising generating an instruction based on the comparison between the extracted circuit feature information and the layout design pattern.

20. A machine-implemented system that facilitates utilizing a resolution enhancement for a circuit feature, comprising:
    means for providing at least one two-dimensional image of the circuit feature; means for extracting pattern defect information from the two-dimensional image; means for generating at least one instruction for at least one of a feed forward control and a feedback control based at least in part on the pattern defect information and an inference obtained from a classifier that locates a hyper-surface of possible pattern defect information associated with the extracted pattern defect information, wherein the possible pattern of defect information is a set of previously extracted pattern defect information; and
    means for utilizing the at least one instruction with a process component to minimize an error.

* * * * *